United States Patent
Müller

(10) Patent No.: US 11,973,300 B2
(45) Date of Patent: Apr. 30, 2024

(54) SWITCH CABINET HAVING A POWER CONVERTER HAVING A CABLE CONNECTION ELEMENT

(71) Applicant: Siemens Aktiengesellschaft, Munich (DE)

(72) Inventor: Volker Müller, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 651 days.

(21) Appl. No.: 16/767,026

(22) PCT Filed: Oct. 31, 2018

(86) PCT No.: PCT/EP2018/079832
§ 371 (c)(1),
(2) Date: May 26, 2020

(87) PCT Pub. No.: WO2019/101485
PCT Pub. Date: May 31, 2019

(65) Prior Publication Data
US 2020/0395689 A1 Dec. 17, 2020

(30) Foreign Application Priority Data
Nov. 27, 2017 (EP) .................................... 17203778

(51) Int. Cl.
*H01R 4/30* (2006.01)
*H01R 11/12* (2006.01)
(Continued)

(52) U.S. Cl.
CPC ............. *H01R 4/305* (2013.01); *H01R 11/12* (2013.01); *H02B 1/30* (2013.01); *H02M 7/003* (2013.01)

(58) Field of Classification Search
CPC ........... H02M 7/003; H02B 1/04; H02B 1/06; H02B 13/00; H02B 1/012; H02B 1/30;
(Continued)

(56) References Cited

U.S. PATENT DOCUMENTS

| 2,872,506 A | 2/1959 | Flubacker | |
| 8,740,657 B2 * | 6/2014 | Byron | .................... H01R 11/12 439/777 |

(Continued)

FOREIGN PATENT DOCUMENTS

| AU | 2009293086 A1 * | 3/2011 | ................ H01J 3/14 |
| CN | 101741226 A | 6/2010 | |

(Continued)

OTHER PUBLICATIONS

PCT International Search Report and Written Opinion of International Searching Authority dated Feb. 13, 2019 corresponding to PCT International Application No. PCT/EP2018/079832 filed Oct. 31, 2018.

*Primary Examiner* — Jean F Duverne
(74) *Attorney, Agent, or Firm* — Henry M. Feiereisen LLC

(57) ABSTRACT

A switch cabinet includes an electric component, e.g. a power converter, having at least three cable connection elements. Each of the cable connection elements has an electric contact area capable of being contacted by a cable lug, and an assembly area. The cable connection element is fastenable at the assembly area to a body of the electric component and is connected to the body of the electric component at the assembly area. The electric contact area and the assembly area are arranged on the cable connection element in such a way that a plane of the electric contact area and a plane of the assembly area intersect at a positioning angle.

6 Claims, 3 Drawing Sheets

(51) Int. Cl.
*H02B 1/30* (2006.01)
*H02M 7/00* (2006.01)

(58) Field of Classification Search
CPC .... H05K 5/0247; H05K 7/2089; H01R 11/12; H01R 11/09; H01R 13/20; H01R 13/506; H01R 13/512; H01R 13/6315; H01R 2101/00; H01R 2201/20; H01R 24/76; H01R 31/06; H01R 4/30; H01R 4/304; H01R 4/305; H01R 4/34; H01R 4/4854; H01R 4/62; H01R 9/22; H01R 9/26
See application file for complete search history.

(56) References Cited

U.S. PATENT DOCUMENTS

| | | | |
|---|---|---|---|
| 9,231,491 B2* | 1/2016 | Benson | H05K 7/2089 |
| 9,716,372 B2 | 7/2017 | Strong et al. | |
| 10,177,515 B2* | 1/2019 | Whipple | H02B 1/32 |
| 10,847,954 B1* | 11/2020 | McGettigan | H02B 1/202 |
| 2004/0072474 A1 | 4/2004 | Nyblin et al. | |
| 2005/0284739 A1* | 12/2005 | Rowe | H01H 1/5855 |
| | | | 200/293 |
| 2008/0175550 A1 | 7/2008 | Coburn et al. | |
| 2010/0255715 A1 | 10/2010 | Walker et al. | |
| 2013/0273771 A1 | 10/2013 | Byron | |
| 2014/0192455 A1 | 7/2014 | Yoshida et al. | |
| 2014/0213117 A1 | 7/2014 | Trinh | |

FOREIGN PATENT DOCUMENTS

| | | |
|---|---|---|
| CN | 204732705 U | 10/2015 |
| CN | 105932550 A | 9/2016 |
| CN | 106450829 A | 2/2017 |
| DE | 968 689 C | 3/1958 |
| DE | 10 2010 011 383 A1 | 9/2011 |
| EP | 2 237 377 A1 | 10/2010 |
| EP | 1 350 302 B1 | 10/2014 |
| RU | 79724 U1 | 1/2009 |
| RU | 2510553 C2 | 3/2014 |

* cited by examiner

FIG 3
FIG 4
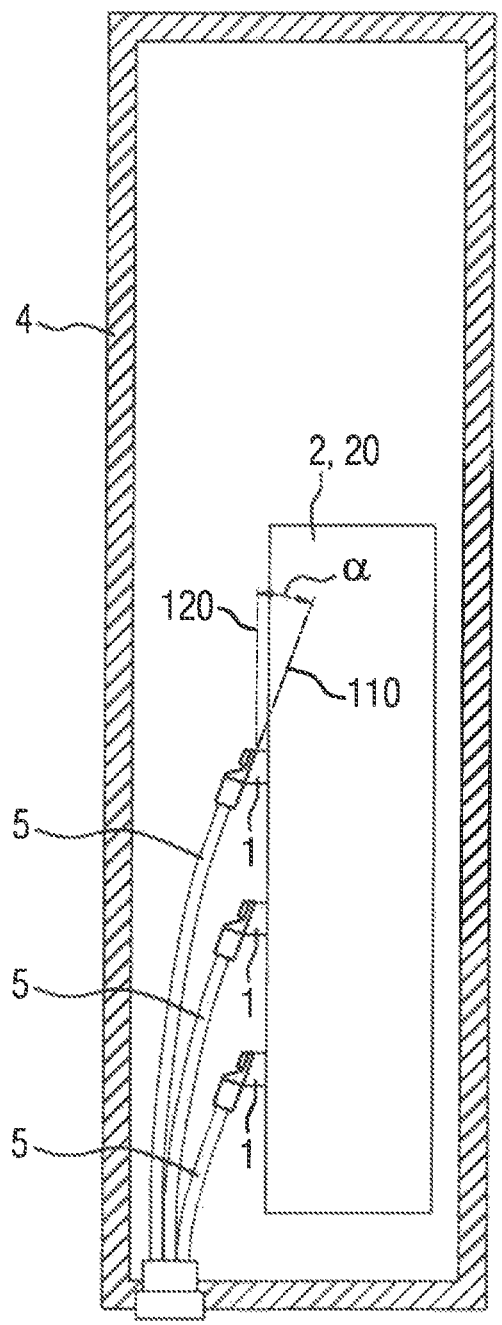
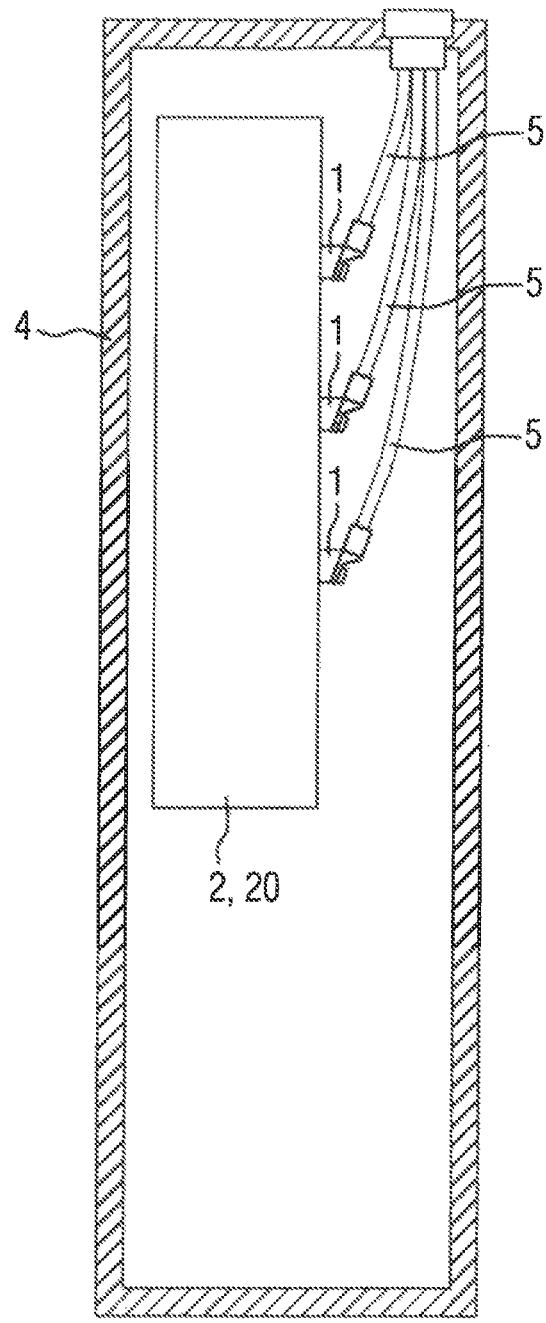

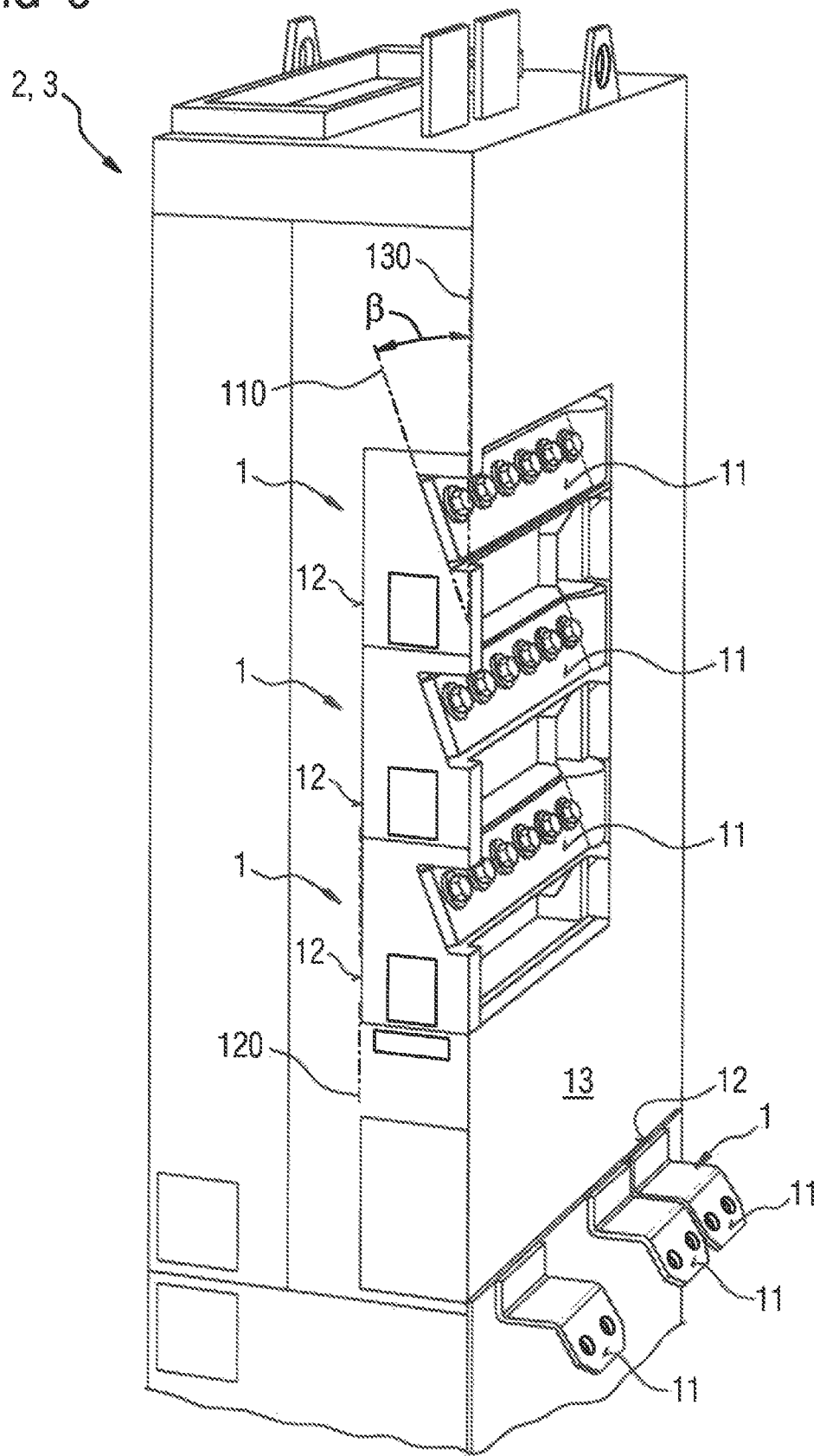

SWITCH CABINET HAVING A POWER CONVERTER HAVING A CABLE CONNECTION ELEMENT

CROSS-REFERENCES TO RELATED APPLICATIONS

This application is the U.S. National Stage of International Application No. PCT/EP2018/079832, filed Oct. 31, 2018, which designated the United States and has been published as International Publication No. WO 2019/101485 A1 and which claims the priority of European Patent Application, Serial No. 17203778.0, filed Nov. 27, 2017, pursuant to 35 U.S.C. 119(a)-(d).

BACKGROUND OF THE INVENTION

The invention relates to a switchgear cabinet with a power converter with a cable connection element, wherein the cable connection element has an electrical contact area and an assembly area, wherein the electrical contact area can be brought into contact with a cable lug, wherein the cable connection element can be fastened at the assembly area to a body, wherein the cable connection element is connected at the assembly area to the body of the power converter.

For the exchange of electrical energy, electrical components are usually brought into contact with cables via connection elements, also referred to as cable connection elements or terminals. In this context, the cable connection element may for example be embodied for receiving a cable lug or, alternatively, as a connection rail or busbar for example, for receiving a plurality of cable lugs. One example of an electrical component is a power converter. In larger components which are arranged in a switchgear cabinet, such as power converters for example, cable access often takes place either from below (typically through the cabinet base) or from above (typically through the top of the cabinet). The cables have cable lugs at their ends, which are screwed flat onto the terminals by means of screws. The greater the power of the electrical component, the thicker and more inflexible the cables. Particularly in the case of a plurality of cables, such as in the case of supplying energy from a three-phase power supply system for example, the cables have to be bent during assembly, which both makes assembly difficult and necessitates a greater space requirement due to minimal bending radii.

The object underlying the invention is that of improving a cable connection element in a cabinet with a power converter.

SUMMARY OF THE INVENTION

This object is achieved by a switchgear cabinet with a power converter with a cable connection element, wherein the cable connection element has an electrical contact area and an assembly area, wherein the electrical contact area can be brought into contact with a cable lug, wherein the cable connection element can be fastened at the assembly area to a body, wherein the electrical contact area and the assembly area are arranged on the cable connection element such that the plane of the electrical contact area and the plane of the assembly area intersect in a positioning angle, wherein the cable connection element is connected at the assembly area to the body of the power converter, wherein the electrical component has at least three cable connection elements.

Advantageous embodiments of the invention are specified in the dependent claims.

The invention is based on the knowledge that the inclined position of the electrical contact area in relation to the assembly area means that considerably less space is required for bending the cable(s) and/or it is possible for the bending of the cable(s) to turn out considerably lower. In this context, the electrical contact area can be embodied for connecting to a cable lug or, for example, as a connection rail, for receiving a large number of cable lugs. While, in the straight cable connection elements without inclination present by default, multiple bendings of the cable occur, for example in an S-shaped profile, the cable pathway adapts to the natural flow of the cable to a more pronounced extent due to the inclined position of the electrical contact area. This means that bendings in the cable are reduced in number and severity. Due to the reduced number of bendings in the cable, the mechanical stresses in the cable are furthermore reduced. This lowers the forces transferred to the cable connection element, so that the connection can be carried out in a simpler, in particular smaller and more cost-effective manner.

The possibility of realizing a considerably more compact cable connection area with straight standard cable lugs and, in doing so, simultaneously reducing the forces occurring on the cable connection, is particularly advantageous. By varying the positioning angle, it is also possible to use the optimal positioning angle for the application.

Compared to an alternative solution on the market using cable lugs with oblique connection tabs, in the connection element according to the invention it is possible to use standard cable lugs. Particularly in the case of different positioning angles with different cable connection elements on one electrical component, it is particularly advantageous to use cable lugs of the same kind, particularly with regard to using common parts. This makes it possible to achieve the same advantages. Likewise, it is also possible in a simple manner to use specific cable terminations which are only available on the market to a lesser extent.

In this context, the electrical components serve as bodies to which the cable connection element is fastened. The fastening may take place, for example, to the surface of the electrical component. The electrical component may involve a power converter, for example. This may be arranged in a switchgear cabinet. It is also possible for the electrical component to be situated outside a switchgear cabinet. Particularly in a switchgear cabinet, space is usually very limited, so that only little space remains for guiding the cables, which is utilized to the best possible extent with the cable connection element.

By means of the cable connection element, electrical energy is transferred between a cable and components in the interior of the electrical component. In the case of the components in the interior of the electrical component, the example of the power converter may involve semiconductor structural elements with which an electrical connection is established.

The cable connection element may be designed in one piece and, in doing so, have an angle α between the plane of the electrical contact area and the plane of the assembly area. Alternatively, it is also possible for the cable connection element to be designed in multiple pieces, in particular in two pieces. In this context, a first conductive part serves to connect to the cable while a second part serves to fasten to the body, for example as an adapter. The body may involve a housing or a further assembly area of a power converter, for example. In this context, the adapter may be embodied such that after joining the two parts of the cable connection element, the plane of the electrical contact area and the plane of the assembly area intersect.

In this context, the electrical component has at least three cable connection elements. Three cables are required for connecting to a three-phase power supply system. Particularly electrical components with greater power, for example above 100 kW, are frequently supplied with electrical energy from a three-phase power supply system. At the same time, due to the high power, such large cable cross-sections are required which lessen the pliability of the cables. Furthermore, minimum radii need to be observed in part when bending the cables. When using electrical contact areas, which are oriented in parallel with the surface of the housing, a greater distance needs to be provided between the individual cable connection elements, so that the cable paths of the individual cables do not impede one another. Due to the inclined position of the electrical contact area, the cable connection elements can be arranged considerably closer to one another, as the cables do not need to be bent in order to avoid covering the other remaining connection elements. This means that the cables can be connected to the electrical component in a particularly spatially compact manner, without having to provide pronounced bendings in the cable. At the same time, the occurring mechanical forces are relatively low. It is thus possible, for example, to arrange the individual cable connection elements at a distance of between 5 cm and 20 cm from one another.

In this context, it has proven particularly advantageous if the positioning angle differs among the different cable connection elements. This makes it possible for the different cable pathways of the individual cables to be realized with low bendings in a simple manner.

In an advantageous embodiment of the invention, the plane of the electrical contact area and the plane of the assembly area intersect in an angle in the range between 5° and 45°. This angle is also referred to as the positioning angle. In order to keep the bending of the cable as low as possible, an inclined connection element or an inclined connection rail with a positioning angle in said range have proven particularly advantageous for guiding the cables. This makes it possible to avoid guiding the cables close to the electrical component and ensure a sufficient distance between cable and electrical component.

In a further advantageous embodiment of the invention, the plane of the electrical contact area and the plane of the surface of the electrical component situated in the surrounding area of the electrical contact area intersect, in particular they intersect in a further angle in the range between 5° and 45°. The advantages of the cable connection element are shown in particular if the electrical contact area is inclined in relation to the surface of the housing of the electrical components which is situated in the immediate surrounding area of the cable connection element. In particular, this is the case if the electrical component or the electrical components are arranged in a spatially severely limited surrounding area, as is the case in a switchgear cabinet for example. This makes it possible to achieve a particularly space-saving arrangement, as different cable pathways of the individual cables can be achieved in a simple manner with only low bendings of the cables.

In a further advantageous embodiment of the invention, the at least two of the cable connection elements are arranged one above the other in the switchgear cabinet, wherein cables connected to the respective cable connection elements via the cable lug are guided out of the switchgear cabinet via the base or the top of the switchgear cabinet. By arranging them one above the other, the cables are guided in close proximity to one another and get in each other's way as a result. This effect can be averted in a particularly advantageous manner by the cable connection elements having a positioning angle. This then not only ensures that the bendings of the cables are lessened, but also that the cables only exert a low amount of pressure on one another.

In a further advantageous embodiment of the invention, the positioning angles of the different cable connection elements differ. Due to the different positioning angles, the cables can be guided in the switchgear cabinet in a particularly space-saving manner. This applies in particular in the case where the cable connection elements are arranged one above the other. Due to the different positioning angles, the mutual pressure of the cables on one another can then be reduced further.

BRIEF DESCRIPTION OF THE DRAWING

The invention is described and explained in more detail below on the basis of the exemplary embodiments shown in the figures, in which:

FIG. 3, FIG. 4 show exemplary embodiments of a cable connection element with inclined electrical contact area, and FIG. 5 shows a power converter with inclined cable connection elements.

DETAILED DESCRIPTION OF PREFERRED EMBODIMENTS

Figure 1:
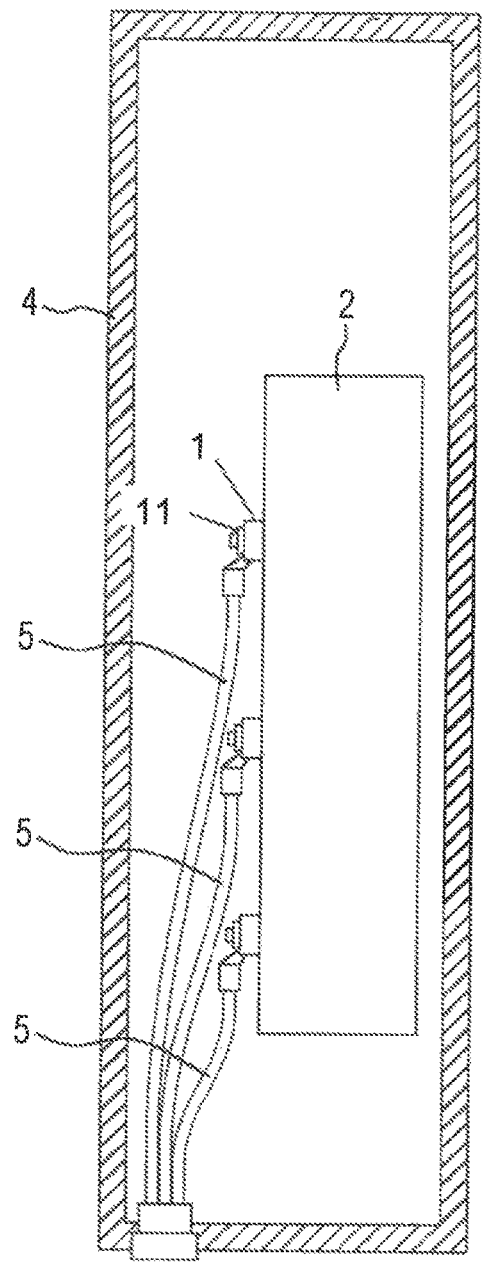
FIG. 1 shows a connection from the prior art.

FIG. 1 shows an arrangement known from the prior art with a switchgear cabinet 4, in which an electrical component 2 is arranged. This electrical component 2 is supplied with electrical energy via three cables 5. The cables 5 are connected to the electrical component 2 via connection elements 1. The contact area 11 is oriented in parallel in relation to the area of the electrical component 2, to which the connection elements on the electrical component 2 are attached. As a result, the cables 5 are bent in an S-shape, in order to avoid covering the connection elements of the other cables 5 and simultaneously in order to be able to be guided through the lead-through in the switchgear cabinet 4.

Figure 2:
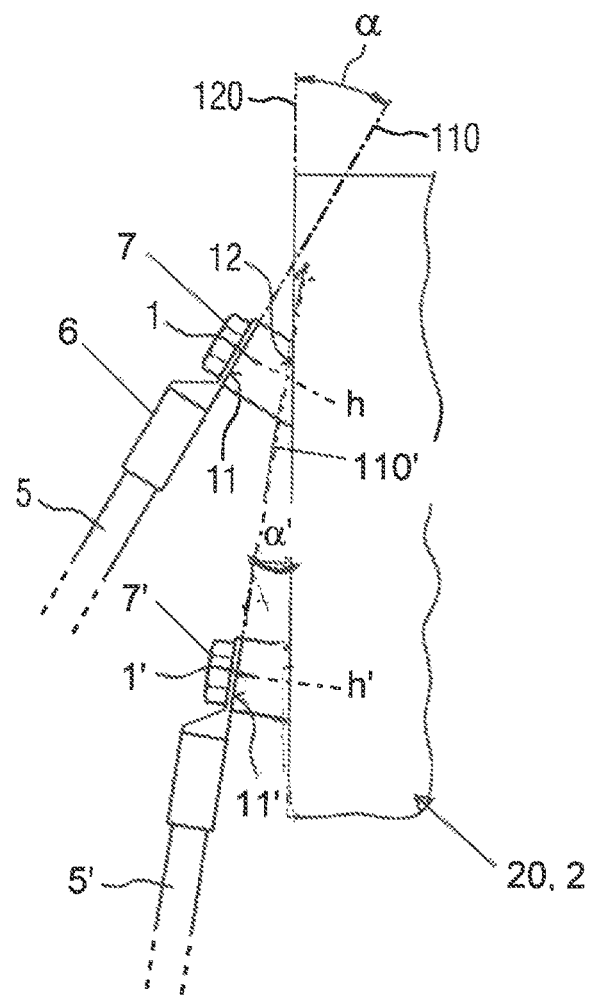
FIG. 2 shows a cable connection element.

FIG. 2 shows a cable connection element 1 according to the invention. The cable 5 is fastened to the electrical contact area 11 of the cable connection element 1, for example by means of a cable lug 6 and a screw 7, which is screwed into the cable connection element 1 in the direction h. The cable connection element 1 is mechanically connected at the assembly area 12 to a body 20 or an electrical component 2, wherein the assembly area 12 defines a first plane 120. The contact area 11 defines a secod plane 110 which is inclined in relation to the first plane 120 of the assembly area 12. This means that the second plane 110 of the electrical contact area 11 and first the plane 120 of the assembly area 12 intersect in an angle α. This angle α is also referred to as the positioning angle. FIG. 2 shows a further cable connection element 1' with a cable 5' located below the cable connection element 1. The second plane 110' of the electrical contact area 11' and the first plane 120 of the assembly area 12 intersect in an angle α' that is different from the angle α, with α'<α. A screw 7', which is screwed into the cable connection element 1' in the direction h'. The directions h, h' are normal to the respective second planes 110, 110'.

FIG. 3 shows an exemplary embodiment of a switchgear cabinet 4, in which an electrical component 2 is arranged. Here too, the electrical component 2 is also supplied with electrical energy via three cables 5. However, the electrical connection to the electrical component 2 takes place by means of a cable connection element 1 according to FIG. 2 in each case. In this context, the body 20 represents the electrical component 2 in this exemplary embodiment. Here, the cable connection element 1 has the electrical contact area 11 for connecting to the cable 5, which is inclined in relation to the assembly area 12, at which the cable connection element 1 is fastened to the electrical component 2. Due to this inclination by the angle α, the cables 5 can be guided with few bendings on the path from the cable lead-through of the switchgear cabinet 4 to the cable connection element 1. This likewise reduces the mechanical forces transferred from the cable 5 to the cable connection element 1. In this context, the cable lead-through may be arranged at the base of the switchgear cabinet 4, as shown in FIG. 3, or on the top of the switchgear cabinet 4 according to FIG. 4. With regard to FIG. 4, reference is made to the description relating to FIG. 3 and the reference characters therein.

FIG. 5 shows a power converter 3 as electrical component 2. The electrical terminals are designed as cable connection elements 1, in which the electrical contact area 11 is inclined in relation to the assembly area 12. In this context, the plane 120 of the assembly area 12 is arranged with an offset in relation to the plane 130 of the surface of the electrical component 2 situated in the surrounding area of the electrical contact area 11. This offset arrangement may be arranged offset in parallel here, or may also have an angle in relation to one another. The plane 110 of the electrical contact area 11 and the plane 130 of the surface 13 of the electrical component 2 situated in the surrounding area of the electrical contact area 11 intersect here in a further angle β. This makes it possible to guide the cables in a particularly advantageous manner, as due to this further angle β it is also possible for the cables to flow in a simple manner, without pronounced bendings in the cables (not shown here), at a desired distance from the surface, in particular from the surface situated in the surrounding area of the electrical contact area 11, of the power converter 3.

In summary, the invention relates to a cable connection element with an electrical contact area and an assembly area, wherein the electrical contact area can be brought into contact with a cable lug, wherein the cable connection element can be fastened at the assembly area to a body. In order to improve the cable connection element, it is proposed that the electrical contact area and the assembly area are arranged on the cable connection element such that the plane of the electrical contact area and the plane of the assembly area intersect. The invention further relates to an electrical component, in particular a power converter, with a cable connection element of this kind, wherein the cable connection element is connected at the assembly area to the electrical component. The invention further relates to a switchgear cabinet with at least one electrical component of this kind.

The invention claimed is:

1. A switchgear cabinet, comprising:
   an electric component comprising an assembly area which defines a first plane,
   at least three cable connection elements, with at least two of the cable connection elements being arranged above one another in the switchgear cabinet, each said cable connection element having a first side configured to be fastened to the assembly area along first plane, and a second side distal from the first side and configured as an electrical contact area located in a second plane and configured to be contacted by a cable lug attached to the electrical contact area by a screw that is screwed into the cable connection element in direction orthogonal to the second plane, with the cable lug connected to a corresponding cable guided out of the switchgear cabinet via a base or a top of the switchgear cabinet, wherein the first plane and the second plane intersect in a non-zero positioning angle having a value in a range between 5° and 45°.

2. The switchgear cabinet of claim 1, wherein the positioning angle of one of the cable connection elements is different from the positioning angle of another one of the cable connection elements.

3. The switchgear cabinet of claim 1, wherein the second plane of the electrical contact area and a plane of a surface of the electric component in a surrounding area of the electrical contact area intersect in a further angle between 5° and 45°.

4. The switchgear cabinet of claim 1, wherein the electric component is a power converter.

5. The switchgear cabinet of claim 2, wherein the cables connected to the cable connection elements are power cables.

6. The switchgear cabinet of claim 1, wherein the cable lug is a straight standard cable lug.

* * * * *